United States Patent [19]
Palmer

[11] 4,063,169
[45] Dec. 13, 1977

[54] METHOD AND APPARATUS FOR MICROWAVE FREQUENCY COUNTING

[75] Inventor: Roger C. Palmer, Edmonds, Wash.

[73] Assignee: John Fluke Manufacturing Company, Inc., Mountlake Terrace, Wash.

[21] Appl. No.: 675,468

[22] Filed: Apr. 9, 1976

[51] Int. Cl.² .......................................... G01R 23/14
[52] U.S. Cl. .............................. 324/79 D; 324/77 CS
[58] Field of Search ............... 324/76 R, 77 CS, 77 C, 324/79 R, 79 D

[56] References Cited

U.S. PATENT DOCUMENTS

| | | | |
|---|---|---|---|
| 2,919,403 | 12/1959 | Buntenbach | 324/79 D |
| 3,110,861 | 11/1963 | Hurvitz | 324/77 CS |
| 3,403,338 | 9/1968 | Martin | 324/79 D |

*Primary Examiner*—Rudolph V. Rolinec
*Assistant Examiner*—Michael J. Tokar
*Attorney, Agent, or Firm*—Christensen, O'Connor, Garrison & Havelka

[57] ABSTRACT

A microwave input signal whose frequency is to be determined is mixed in a mixer with a local oscillator (LO) signal and the resultant difference signal is applied to a low pass filter. The frequency of the LO signal is controlled by a digital processor that samples the output of the low pass filter. Initially the LO signal is at zero. Thereafter, the frequency of the LO signal is sequentially stepped through the fundamental and, then, the harmonics of a principal oscillator signal having a fundamental frequency $F_R$. When the difference frequency falls within the direct counting capability of a digital counter, the digital processor opens a main gate for a short period of time, and a first difference frequency ($F_1$) count is made and stored. The frequency of the LO signal is then offset by a known amount, and a second difference frequency ($F_2$) count is made and stored — if this $F_2$ count is within the direct counting capability of the digital counter. Alternatively, if this $F_2$ count lies beyond the direct counting capability of the digital counter, the frequency of the LO signal is stepped to the next $F_R$ offset harmonic and, then, an alternate $F_2$ count is made and stored. The relationship between $F_1$ and $F_2$ determines whether or not the LO signal frequency, when the counts were made, was above or below the frequency of the input signal. Subsequent to the $F_1$ and $F_2$ counts being made and stored, the main gate is again opened, this time for a precise period of time related to the requisite resolution required and the digital counter makes and stores a third difference frequency ($F_3$) count. $F_3$ is algebraically summed with the LO signal frequency produced when $F_3$ was determined, to obtain a displayable count equal to the frequency of the input signal. A jitter generator is provided to randomly frequency modulate the LO signal to preclude phase lock between the LO signal and the input signal, when the $F_1$ and $F_2$ counts are being made and stored during a counting sequence.

25 Claims, 3 Drawing Figures

METHOD AND APPARATUS FOR MICROWAVE FREQUENCY COUNTING

RELATIONSHIP TO OTHER APPLICATIONS

This application is related to U.S. Patent Application Ser. No. 571,596, filed Apr. 25, 1975 and now abandoned by the inventor named herein and entitled "Microwave Frequency Counter". As to common subject matter, the benefit of the filing date of that application is herein claimed under 35 USC 120.

FIELD OF THE INVENTION

This invention relates to microwave frequency measurement and, more particularly, to microwave frequency counters having the ability to provide a digital display of the frequency of an input signal being measured, to a predetermined resolution, where the frequency of the signal being measured may be higher than the direct counting capability of a digital frequency counter incorporated within the device.

BACKGROUND OF THE INVENTION

There is an ever increasing use of microwave frequencies for both commercial and military environments and, accordingly, there are great demands for high accuracy frequency measuring devices. In particular, there are demands for frequency measuring devices having extremely broad bandwidth capabilities, and good FM tolerance, sensitivity, and acquisition time. Specifically, one of the demands that is now being made is for commercial frequency measuring equipment operable in the 10 Hz to 18 GHz range.

One of the difficulties that has been encountered with respect to known devices is their relatively long acquisition time. While some devices have been able to improve sensitivity, they have done so at the expense of decreased FM tolerance. Of more pressing concern, however, is the fact that even "state-of-the-art" solid state devices that can be used for frequency measurement are incapable of switching in the upper spectrum of the microwave frequency range noted above. That is, many direct counting digital frequency counters, which may be considered "state-of-the-art" or "off-the-shelf", are incapable of direct counting at frequencies above 1000 MHz. Thus, for any frequency measuring device to operate in ranges over 1000 MHz, it is necessary to provide circuits which convert or prescale the microwave frequencies down to a frequency that can be counted by such direct counting digital frequency counters.

Several techniques have been used by prior art frequency counters and frequency meters to pre-condition microwave frequencies down to countable levels. Two of the most popular are the transfer oscillator technique and the heterodyne technique. In a transfer oscillator type of frequency counter, a low frequency (usually 100 to 200 MHz) oscillator is phase-locked to a subharmonic of the signal to be measured. Circuit means are provided to determine the harmonic number of the sub-harmonic; and the output of the transfer oscillator — the low frequency oscillator — is multiplied by the harmonic number to provide an indication of the unknown frequency being measured. This technique can be carried out by using direct counting digital circuitry with a gate time controlled by a factor equivalent to the harmonic number which has been determined, so that the resulting number counted by the direct counting circuitry is equivalent to the microwave frequency.

Although the transfer oscillator technique for measuring high frequency signals, especially signals in the microwave frequency range, provides good sensitivity, because of the relatively narrow bandwidth of the phase-locked loop used, transfer oscillator circuits employing this technique have a number of disadvantages, especially when used in the upper (GHz) frequency ranges. These disadvantages include:

a. Long acquisition time. [For a counting resolution to 1 Hz, a time period equal to the number of seconds multiplied by the harmonic number, is required. The long acquisition time also results from the fact that a phase-locked loop has an appreciable finite lock-in time, and resolution cannot begin until phase-lock is established.]

b. Poor FM tolerance. [This is a result of the limited bandwidth of the phase-locked loop.]

c. In a short measurement interval, poor resolution of the frequency being measured. [This is a corollary of (a) above.]

An improved transfer oscillator having higher FM tolerance is taught in Voyles et al, U.S. Pat. No. 3,781,678 issued Dec. 25, 1973. In that patent there is taught an automatic transfer oscillator including a frequency locked loop in combination with harmonic number determination circuitry. The counting circuit counts both the frequency of a local oscillator signal and the intermediate frequency produced by the frequency locked loop concurrently over a given time period.

Because of the disadvantages of transfer oscillators, discussed above, a more frequent commercial embodiment of automatic frequency counters, capable of counting into the microwave frequency range, utilizes a heterodyne circuit. Typically, a heterodyne counter converts down the frequency being measured to directly countable frequencies using a mixer. The signal being measured is fed to one input port of the mixer and a local oscillator signal is fed to another input port of the mixer. A low pass filter passes the difference frequency (between the input signal and the local oscillator signal) output of the mixer. If no difference frequency — referred to as an intermediate frequency or I.F. — is sensed with the local oscillator set at its lowest frequency, the local oscillator is stepped by an integral amount, and the presence or absence of an I.F. at the output of the low pass filter is again looked for by a detector. If none is noted, the local oscillator frequency is again stepped. This sequential stepping continues until such time as an I.F. is detected. The low pass filter's bandwidth is such that any I.F. frequency detected is within the direct counting capability of a digital counter. The I.F. detected is counted and the count is added to the local oscillator frequency to determine the frequency of the input signal and the result is displayed on a digital display. In such arrangements the local oscillator frequency must always be below the frequency of the input signal, so that the difference frequency or I.F. may be added to the local oscillator frequency, thereby requiring that every measurement sequence start at the lowest oscillator frequency and step upwards until such time as a countable I.F. is sensed.

The advantages of the use of a heterodyne technique in the measurement of microwave frequency signals include good FM tolerance and a resolution time no greater than one second, to obtain 1 Hz resolution. However several disadvantages exist, particularly when this technique is used for the measurement of the frequency of signals in the microwave frequency range. Among these disadvantages are the following:

a. Acquisition time is longer than desirable when the frequency of the signal to be measured is high. [Because the local oscillator frequency must be below the frequency of the signal to be measured, it is necessary to always start at zero or a low level and step the local oscillator until such time as an I.F. is sensed and passed to the counter.]

b. High frequency signal sensitivity is poor. [The local oscillator signal occurs at the output of a harmonic generator, the particular step harmonic being selected by a harmonic selection filter. As the frequency increases, the power available decreases, whereby mixer losses decrease sensitivity.]

In addition, the tuneable (harmonic selection) filter of a heterodyne frequency counter must have its pass bands very tightly controlled, so that only the selected harmonic is present at the local oscillator input to the mixer. This disadvantage will be more readily understood if it is realized that, if the tuneable or harmonic selection filter allows any energy from any unwanted harmonic into the mixer, two adjacent harmonics may beat together in the mixer, causing the production of a spurious signal, which may be passed by the low pass filter so as to mask the desired I.F. signal. Or, at high frequencies, the wrong harmonic may be chosen resulting in an erroneous display based on the addition of the I.F. to the wrong local oscillator frequency, whereas the actual frequency may be one or more orders of magnitude, (of the harmonic generator base frequency) away from the displayed frequency.

As noted above, one disadvantage of heterodyne frequency counters is the decreased power that is available from the local oscillator at higher frequencies, and the resultant decrease in sensitivity. The conversion losses in the mixer may reach such a level that no useable I.F. can be detected. Obviously, in order to minimize this problem, the base frequency of the harmonic generator — the reference frequency — should be as high as possible. In order to accommodate a higher reference frequency, however, a faster direct count capability is required, as well as a wider I.F. bandwidth. Concomitant with faster direct counting capabilities and wider I.F. bandwidth, however, is increased noise in the I.F. circuitry, and a resultant decrease in the sensitivity of the counter.

Several prior art heterodyne-type frequency counters are described in: U.S. Pat. No. 3,403,338 issued to Martin on Sept. 24, 1968; U.S. Pat. No. 3,750,014 issued to Gaw on July 31, 1973; 1 and U.S. Pat. No. 3,662,261 issued to Barthold et al on May 9, 1972.

In order to increase the sensitivity and acquisition time of prior art heterodyne-type frequency counters, sophisticated tuned filters using YIG (Yttrium-iron-garnet) spheres have been developed. For example, the Barthold et al patent teaches a device where a YIG member is placed in a carefully machined slot in the center conductor of a coaxial line. Obviously, the expensiveness of these filters makes frequency counters using them more expensive than desirable.

In any event, it will be apparent to those skilled in the art that an improved microwave frequency counter, (e.g. a frequency counter having an extremely broad frequency counting range) can be obtained if wider harmonic spacing can be utilized (with a resultant decrease in the requirement for the inclusion of a critical, controllable or tuneable filter) and if the reference oscillator frequency, upon which the harmonics of an harmonic generator are based, is higher than the maximum direct counting capability of a digital counter included in the system.

Therefore, it is an object of this invention to provide a frequency counter for measuring the frequency of an input signal thereto, over a very broad frequency bandwidth, and providing a digital display of the frequency being measured to any desired resolution in a short period of time, e.g., one second for 1 Hz resolution.

Another object of this invention is to provide a frequency measurement system wherein the frequency of the input signal may be many times higher than the direct count capability of a digital counter included in the system.

A further object of this invention is to provide a frequency counting method and apparatus having high sensitivity and FM tolerance, and relatively short acquisition time. Yet a further object of this invention is to provide a new and improved frequency counter wherein all of the measuring components operate at lower frequencies then the microwave frequencies normally measured.

Another object of this invention is to provide a very wide bandwidth microwave frequency counter wherein the components used in the circuits of the counter, notwithstanding its very wide bandwidth, are relatively inexpensive and non-critical in design.

A still further object of this invention is to provide an improved method of making frequency measurements of input signals whose frequency is unknown, but may be in the microwave range.

BRIEF SUMMARY OF THE INVENTION

In accordance with features of this invention an improved microwave counter, having an extremely broad frequency measuring range is provided. While the circuits of the present invention are, in many respects, superficially similar to a heterodyne counter, the invention operates in a somewhat different manner to achieve improved results. The direct count capability of a digital counter forming a portion of the overall frequency counter, preferably, is less than the fundamental frequency of a local oscillator also forming a portion of the invention. One of the major advantages of the present invention is extremely good FM tolerance. As will be better understood from the following description of the preferred form of the invention, the frequency counter of the invention always makes at least two tests at different local oscillator frequencies, no matter what frequency is being measured. Further, the invention includes the ability to algebraically sum an appropriate local oscillator frequency with a difference frequency or I.F. that has been counted and stored. The circuits of the present invention permit the local oscillator frequency to be either above or below the frequency of the input signal being measured.

In its preferred form, the microwave input signal whose frequency is to be determined is mixed with a local oscillator (LO) signal. The resultant difference signal, if it passes through a low pass filter adapted to pass signals falling within the direct counting capability of a digital counter, is detected by a digital processor. The digital processor controls the frequency of the local oscillator signal such that principal local oscillator signals are first produced. The principal local oscillator signals start at zero, and, thereafter, are sequentially stepped through a frequency range including a fundamental frequency $F_R$ and the harmonics thereof. When a difference frequency is first detected, a main gate is opened for a short period of time and a first difference frequency count ($F_1$) is made and stored by the digital counter. The frequency of the LO signal is then offset by a known amount, and a second difference frequency count ($F_2$) is made and stored — if the second frequency count is within the direct counting capability of the digital counter. Alternatively, if the second difference frequency count lies beyond the direct counting capability of the digital counter, the frequency of the LO signal is stepped to a level offset from the next harmonic and, then, an alternate second difference frequency count ($F_2$) is made and stored. The relationship between the first and second difference frequency counts determines whether or not the local oscillator signal frequency, when the counts were made, was above or below the frequency of the input signal. Subsequent to the first or second frequency counts being made and stored, the main gate is again opened, this time for a precise period of time related to the requisite resolution required and the digital counter makes and stores a third difference frequency count ($F_3$). The third difference frequency count is then algebraically summed with the frequency of the local oscillator signal produced when the third difference frequency count was determined. The result of the algebraic summation is equal to the frequency of the input signal. Further, preferably, a jitter generator is provided to randomly frequency modulate the LO signal to preclude phase lock between the LO signal and the input signal, when the first and second difference frequency counts are being made and stored during a counting sequence.

It will be appreciated from the foregoing discussion that the invention provides a new and improved method and apparatus for microwave frequency counting. The counter has an extremely broad frequency counting range. Because of its method of operation, wider harmonic spacings can be utilized, with the resultant requirement for a less critical, controllable or tuneable filter for controlling the stepping of the local oscillator signal through the harmonics of the reference oscillator signal.

In one form, the local oscillator signal offset value, used to determine the second difference frequency count, is a predetermined value that remains the same throughout the entire frequency range of operation of the invention. It may, for example, be 100 MHz, if the local oscillator frequencies are in the GHz range. In an alternative form, the local oscillator signal offset valve may vary, in accordance with the specific harmonic chosen at any point in the sequence of operation. For example, one offset value may relate to the first, second and third harmonics, another to the fourth, fifth and sixth harmonics etc., through the harmonic range of operation. Since the digital processor controls the offset value, it can be readily programmed to include the chosen value in the algebraic summation step.

BRIEF DESCRIPTION OF THE DRAWINGS

The foregoing and other objects, features and advantages of the present invention are discussed in greater detail hereafter, in association with the accompanying drawings in which:

FIG. 2 is a block diagram of a signal generator suitable for use in the embodiment of the invention illustrated in FIG. 1 formed such that the local oscillator offset value remains constant regardless of which harmonic of a reference signal is used to form the local oscillator signal; and, FIG. 3 is a block diagram of a modification of a signal generator of the type illustrated in FIG. 2 for use in an embodiment of the invention formed such that the local oscillator offset value changes, but relates to the particular harmonic of the reference signal being used to form the local oscillator signal.

DESCRIPTION OF THE PREFERRED EMBODIMENT

The frequency counter of the present invention is, of course, a broad band frequency counter having the ability to count in the microwave frequency range. The frequency counter of the present invention includes a display for visually displaying the frequency of an input signal being counted, and a direct counting digital frequency counter. The frequency of the signal being measured is, in most instances, above the maximum direct counting capability of the digital frequency counter.

In general terms, the frequency counter of the present invention includes an input mixer having at least two inputs and having a frequency bandwidth at least as great as the highest input frequency to be counted. The input signal is applied to a first input of the mixer, and a local oscillator signal is applied to the second input of the mixer. The output of the mixer includes an I.F. or difference frequency signal, i.e. a signal having a frequency equal to the difference between the frequencies of the two input signals. The output of the mixer is fed to a low pass filter, which passes difference frequency signals only when they are below a predetermined maximum frequency. The output of the low pass filter may be fed to an I.F. amplifier having a bandwidth that will accommodate the difference frequency range of the low pass filter.

A reference oscillator also forming part of the frequency counter of the present invention produces a signal at a precise frequency. Forming a further part of the invention is a local oscillator connected to the reference oscillator. The local oscillator produces two different types of signals (principal signals and offset signals). Only one type is produced at any one time. The frequencies of the principal signal are zero, a fundamental frequency ($F_R$) or a harmonic of the fundamental frequency. The frequencies of the offset signals are equal to the principal signal frequencies plus or minus a predetermined frequency offset. The frequency offset may be the same regardless of the frequency of the principal signal, or the frequency offset may change as the frequency of the principal signal changes. A control system, forming part of a hereinafter described digital processor, controls the local oscillator so that its output is either a principal signal or an offset signal, as necessary. As noted above, the local oscillator signal is fed to the second input of the mixer.

A controllable main gate controls the passing of difference frequency signals to the direct counting digital counter. The main gate is controlled by the digital processor in the manner hereinafter described to pass the difference frequency signals for predetermined precise periods of time. The predetermined precise periods of time may be different from one operation of the main gate to the next, as discussed in greater detail hereafter.

As noted above, a digital display also forms a portion of the frequency counter of the present invention. The digital display displays the frequency of the input signal, which is being measured, to a predetermined resolution. Means are provided for controlling the display, as discussed in greater detail hereafter. The displayed value is the algebraic sum of a difference frequency, which has been counted and stored, plus the local oscillator frequency being produced when that difference frequency was derived.

As also noted above, a digital processor also forms part of the frequency counter of the present invention. The digital processor (which may be a microprocessor) performs a plurality of control, storage, summation and other functions. In this regard, the digital processor includes: a band comparator for determining whether a difference frequency, which may be passed by the main gate to the direct counting digital counter, is within the maximum direct counting frequency capability of the digital counter; and, a sequential stepper for sequentially, integrally stepping the local oscillator output frequency through a range, until the band comparator determines that a countable difference frequency has been passed by the low pass filter, as hereinafter discussed in detail.

The digital processor also includes offset control means for controlling the offsetting of the frequency of the local oscillator signal from the frequency of a related principal signal. The offset value may be a constant predetermined value (e.g. 100 MHz) no matter what frequency the local oscillator may be operating at, or a variable offset value that changes at chosen harmonics of the principal local oscillator signal. The digital processor includes further means for storing the difference frequency counts counted by the direct counting digital counter. As more fully discussed hereinafter, in any measuring sequence at least two separate difference frequency signal counts are made and stored. The digital processor also provides means for comparing the difference frequency signal counts that have been stored, to detect certain specific relationships herein discussed.

The digital processor further includes means for controlling the main gate such that the gate will pass difference frequency signals to the direct counting digital counter for predetermined, precise periods of time. As will be better understood from the following discussion, the length of any such precise period of time is determined by the digital processor, and is contingent upon whether or not the frequency counter is merely testing a signal, or is counting a difference frequency so as to display a measured frequency to a given resolution. For a higher resolution — e.g. 1 Hz as compared to 10 KHz — different specific time periods are required. Finally, again in general terms, the digital processor includes means for algebraically adding the digital counter count to the frequency of the local oscillator signal produced when that difference frequency count was derived.

Referring now to the drawing, a detailed description of a frequency counter formed in accordance with this invention follows. As will be better understood from the present description, the frequency counter of this invention may operate with a local oscillator frequency either below or above the frequency of the input signal. The effective measuring bandwidth of each given local oscillator frequency is thereby effectively doubled; however, means must be provided to determine on which side of the input signal frequency the local oscillator frequency lies.

Figure 1:
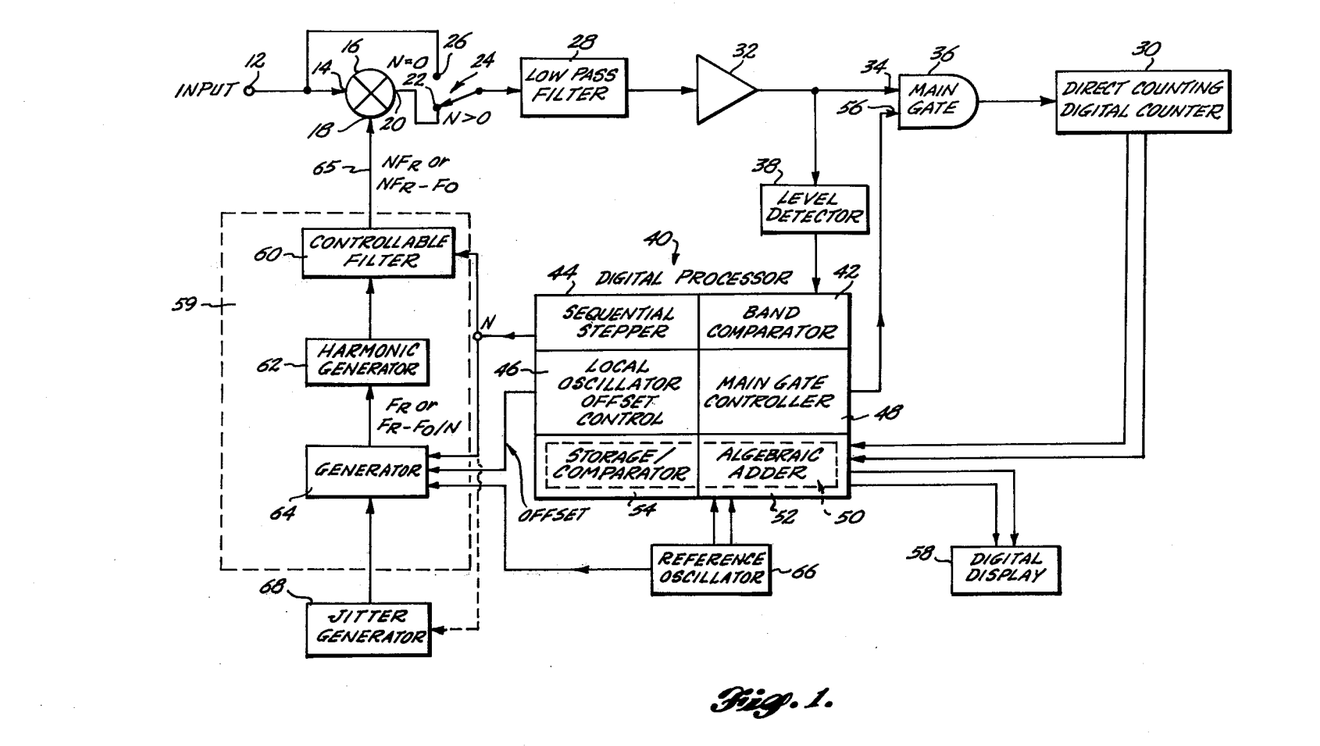
FIG. 1 is a block diagram showing the circuit elements and components of a frequency counter formed in accordance with this invention.

With reference to FIG. 1, which is in conventional single line form, an input signal is fed from an input terminal 12 to a first input 14 of a two-input mixer 16. The second input 18 of the mixer 16 receives a local oscillator signal, generated in the manner discussed in greater detail hereafter. In the usual manner, the output signal of the mixer 16, occurring at an output terminal 20, includes a frequency equal to the frequency difference between the input signal and the local oscillator signal. The output of mixer 16 is fed to a terminal 22 illustrated as a first remote terminal of a circuit switch, illustrated for purposes of simplicity as a single pole-double throw switch 24. The other remote terminal 26 of this switch is connected to the input terminal 12 and its function is discussed in greater detail hereinafter. The common terminal of the switch element 24 is connected to the input of a low pass filter 28.

The difference frequency signal occurring at the output of the mixer 16 may also be referred to as an intermediate frequency of I.F. signal. The low pass filter passes only those I.F. signals having a frequency lying below a predetermined maximum frequency. The predetermined maximum frequency is determined by the maximum direct counting capability of a direct counting digital counter 30, which also forms a part of the frequency counter of this invention. More specifically, any signals passed by the low pass filter 28 are fed to an amplifier 32, which may take the form of a conventional I.F. amplifier. The output of the amplifier 32 is connected to a first or signal input 34 of a main gate 36, and to the input of a level detector 38. The output of the level detector 38 is applied to a band comparator 42 forming part of a digital processor 40. In addition to the band comparator 42, the digital processor includes: a sequential stepper 44; a local oscillator offset control 46; a main gate controller 48; and, an algebraic unit 50. The algebraic unit 50 includes an algebraic adder 52 and a storage/comparator section 54.

When the band comparator determines that an I.F. signal falls within the direct counting capability of the direct counting digital counter 30, the main gate controller 48 produces a gate control output signal. This output signal is applied to a second or enable input 56 of the main gate 36.

The output of the main gate 36 is fed to the count input of the direct counting digital counter 30, whose output, in turn, is fed to the algebraic unit 50 of the digital processor. The algebraic unit 50 produces display control signals that are fed to a digital display 58, on which the frequency of the input signal being measured is displayed, to a given resolution, as discussed in greater detail hereinafter.

The local oscillator 59 of the frequency counter of the invention comprises: a controllable filter 60; a harmonic generator 62; and, a signal generator 64. The local oscillator signal, applied via a conductor 65 to the second input 18 of mixer 16, is derived from the controllable filter 60 which has two inputs — a control input for receiving control signals (denoted by the letter N) produced by the sequential stepper unit 44 of the digital processor 40, and a signal input for receiving signals produced by the harmonic generator 62. The control signals produced by the sequential stepper 44 are also applied to the control input of the signal generator 64.

The signal generator 64 also receives: an offset control signal produced by the local oscillator offset control portion of the digital processor 40; and, a reference signal produced by a reference oscillator 66. The output of the reference oscillator 66 is also fed to the digital processor 40, to control the timing thereof. The signal output of the signal generator 64 is applied to the input of the harmonic generator 62. Finally, a jitter generator 68, which will be discussed in greater detail hereafter, has its output fed to a modulation control input of the signal generator 64. The operating state of the jitter generator is controlled by the digital processor in the manner hereinafter described.

In general terms, unless offset, the frequency of the local oscillator signal is a fundamental frequency ($F_R$) or a harmonic (integral multiple) thereof ($NF_R$). These local oscillator signals are herein referred to as either principal signals or principal local oscillator signals and are locked to the output of the reference oscillator 66. In addition to including the principal local oscillator signals, the local oscillator signal range also includes offset signals. Thus, the actual local oscillator signal may either by a principal signal or an offset signal. The offset signals are offset from the principal local oscillator signal frequencies, either by a predetermined constant offset or by a changeable offset. When offset, the local oscillator signal is herein referred to as either an offset signal or an offset local oscillator signal.

The control output of the sequential stepper 44 is, as discussed above denoted N. N represents an integral value, including zero.

Figures 2, 3:
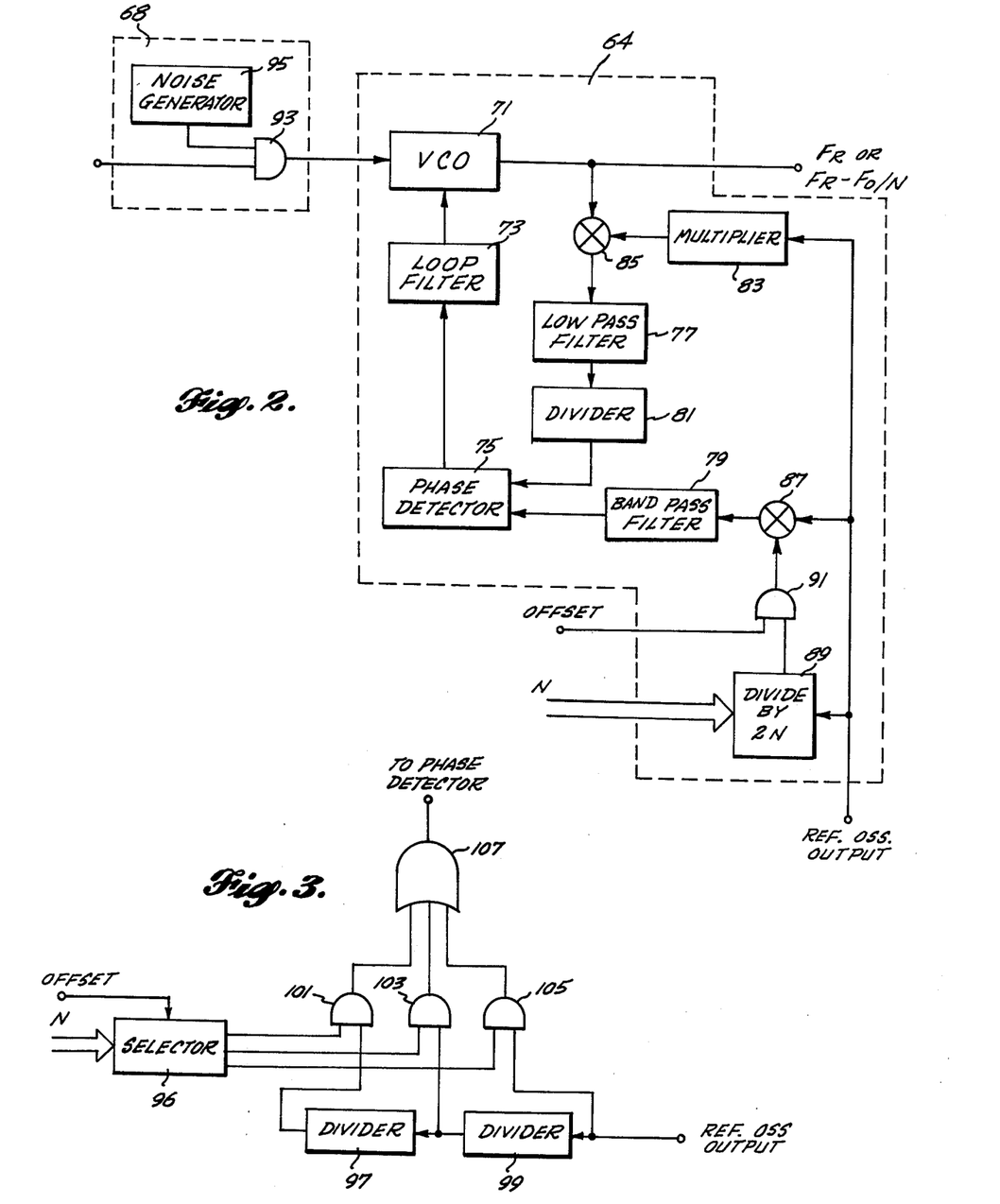

The control output of the local oscillator offset control 46, which is fed to the signal generator 64, controls the output of the generator 64 such that either a signal at the fundamental frequency $F_R$ or a signal offset downwardly by an amount equal to either a constant predetermined offset value $F_O$ divided by N (i.e., $F_O/N$), or by a value that changes as N changes, is produced. Specifically, the signal generator is controlled such that it generates a signal at either the fundamental frequency $F_R$ or at the fundamental frequency minus an offset value. In one case the offset value is such that when a particular harmonic is chosen by the controllable filter the result is a fixed offset $F_0$. Thus, if the chosen harmonic N is 2, the signal generator fundamental frequency, $F_R$, is offset by $F_0/2$ so that the resultant local oscillator signal frequency offset is $F_0$. (It should be noted that the offset in the illustrated embodiment is chosen to create a downward shift. As will be recognized by those skilled in the art, the shift could be upward if desired). In the second case, the offset value changes in a step manner as N changes. For example, it may remain the same for the first three values of N, change for the three values, and change again for the next three values, etc. through the entire range of N values. Signal generators for the first and second cases are illustrated in FIGS. 2 and 3, respectively, and are hereinafter described.

The output of the generator 64 is, in any event, fed to the harmonic generator 62, which is adapted to generate at least as many harmonics of the input signal fed thereto as there are integral steps designated by the maximum number to which N may be stepped by the sequential stepper unit 44. Thus, the output of the harmonic generator 62 contains a number of frequencies. One of these frequencies [$NF_R$ or $N(F_R - F_0/N)$, as the case may be] is selected by the controllable filter 60, in accordance with the control output of the sequential stepper 44. Thus, only the desired harmonic of the signal generator output is passed. This signal forms the local oscillator signal applied to the second input 18 of the mixer 16. Since the controllable filter passes only the desired harmonic of the signal generator output, the frequency of the actual local oscillator signal is either a principal local oscillator signal or an offset local oscillator signal. That is, the local oscillator signal is either at a frequency $NF_R$ (if no offset is being added) or $NF_R - F_O$ (if a fixed offset is being added), where N is equal to the desired harmonic. (If the offset is step changeable as previously discussed then, of course, the value of $R_O$ changes).

In general, the maximum peak-to-peak FM deviation, which may be expected in the input signal to be measured, or which will be tolerated, is predictable, and is herein designated $F_D$. It is an important feature of the present invention that the maximum direct counting capability of the direct counting digital counter 30, designated $F_{DC}$ be less than the principal frequency $F_R$. Further, a relationship exists between the principal frequency $F_R$, the maximum direct counting capability of the digital counter 30 and the maximum FM deviation, $F_D$, that can be tolerated. This relationship is as follows:

$$F_{DC} \geqq F_R/2 + F_D/2 \tag{1}$$

It should also be noted that the amount of offset $F_O$ must be greater than twice the maximum FM deviation, $F_D$, that can be tolerated.

When the integral multiplier N is zero, as occurs at the beginning of a new measuring sequence as discussed in greater detail hereafter, the generator 64 is disabled, and no local oscillator signal is applied to the second input 18 of the mixer 16. When this state of affairs exists the switch element 24 (which may be a solid state switch controlled by the digital processor) connects remote terminal 26 to the common terminal of the switch, so that the low pass filter 28 is connected directly to the input terminal 12. Thus, the mixer 16 is by-passed.

The method of measuring or counting the frequency of a signal applied to the input terminal 12, according to this invention, is next described.

The input signal is applied to the first input terminal 14 of the mixer 16, except in the case where N is zero, and the local oscillator signal is applied to the second input 18 of the mixer 16. The output of the mixer 16 is fed to the low pass filter 28 and, thence, to the amplifier 32 and the level detector 38. If the frequency difference between the input frequency and the local oscillator frequency is above the pass band of the low pass filter 28, the level detector 38 will not detect any signal, the band comparator will not analyze it, and the sequential stepper 44 will automatically increase the integral multiplier N by one. This, of course, has the effect of increasing the frequency of the local oscillator signal by an amount equal to $F_R$. These steps are sequentially repeated, with the output of the low pass filter 28 being sampled during each sequence, until a signal passed by the low pass filter 28 is detected by the level detector and analyzed by the band comparator. That signal is, or course, within the direct counting capability of the digital counter 30 since the pass band of the low pass filter lies with the direct counting capability of the digital counter 30. After the band comparator assures that this is the true state of affairs when such a difference frequency signal is thusly detected, the main gate 36 is opened for a given short period of time, and a count is made of the difference frequency over a given short period of time. This count is stored in the storage and comparator unit 54 of the digital processor 40 as a first frequency count $F_1$.

The local oscillator output frequency is then offset by a given amount, e.g. $F_O$, — which, for purposes of this discussion, is assumed to be downwards — and the output of the low pass filter is again sampled in an attempt to detect a second difference frequency signal. If a second such signal is detected, it is gated to the direct counting digital counter 30 for a given short period of time; and a second frequency count $F_2$ is made and, then, stored in the storage and comparator unit 54 of the digital processor 40. If, when the local oscillator frequency is offset, no difference frequency signal is passed by the low pass filter 28, detected by the level detector 38 and analyzed by the band comparator, the local oscillator signal frequency is increased by one integral multiple (i.e., N is increased by one) by the sequential stepper 44. In this case, the local oscillator frequency now equals the offset frequency plus a new harmonic of the principal frequency $F_R$. For example, if the first attempt to detect a second difference frequency signal was made at a local oscillator frequency of $N_x F_R - F_O$ the second attempt is made at $(N_{x+1}) F_R - F_O$. Since the pass band of the low pass filter 28 is equal to $F_{DC}$, which is always greater than $F_R/2$ [see equation (1)], a suitable difference frequency is now detected, passed to the direct counting digital counter 30, counted and, then, stored as an alternate $F_2$ count.

There is now stored two difference frequency counts, F1 and F2, in the storage and comparator unit 54 of the digital processor 40. Next, the algebraic unit uses these two signals to make certain determinations. First, depending upon required resolution, it decides whether or not either of these two counts can be used to directly calculate the frequency of the input signal. (Normally this action does not occur and an $F_3$ count is made in the manner hereinafter described, and used in such calculation). In the event that neither F1 or F2 can be used, the algebraic unit determines which local oscillator signal (i.e. the one producing $F_1$ or the one producing $F_2$) should be used to produce an $F_3$ count. Regardless of whether or not one of $F_1$ or $F_2$ is usable, or an $F_3$ is to made and used, the algebraic unit 50 further determines an algebraic summation function for use in calculating the frequency of the input signal. The algebraic summation function is determined by comparing $F_1$ and $F_2$, and deciding whether or not the chosen count is to be added to or subtracted from the frequency of the local oscillator signal generated when the count was made.

If no $F_3$ count is to be made, the chosen stored difference frequencies count $F_1$ or $F_2$ is summed in the algebraic adder to the relevant one of the local oscillator frequencies, i.e., the frequency of the local oscillator signal generated when that specific difference frequency count was derived. Alternatively, if an $F_3$ count is to be made, that count is made in the manner hereinafter described and, then, summed with the frequency of the local oscillator signal generated when the $F_3$ count is made.

Which of $F_1$ and $F_2$ is chosen as the count to be added to its related local oscillator frequency (or whose related local oscillator frequency is chosen to be used in deriving the $F_3$ count) is related to the nature of those counts. Normally, either the $F_2$ count (or the local oscillator frequency related to the $F_2$ count, if an $F_3$ count is to be derived) is chosen since, a finite time delay will occur if the system is required to shift back to the $F_1$ related local oscillator frequency prior to an $F_3$ count being made. However, in some cases, the $F_2$ count (or the $F_2$ related local oscillator frequency) is not chosen. This result occurs if the input signal is found to lie between the local oscillator frequency at which the $F_1$ count was made and the local oscillator frequency at which the $F_2$ count was made; and, very close to the latter local oscillator frequency. In such a situation, the $F_1$ count (or the local oscillator signal related thereto if an $F_3$ count is to made), is chosen. This choice is made to avoid FM modulation problems. Specifically, if the input signal is FM modulated even within the allowable range, as discussed above, it is possible, if the frequency to the input signal lies between the local oscillator frequencies at which $F_1$ and $F_2$ are derived, for the modulation value to extend beyond the frequency difference between the input frequency and the closest of $F_1$ and $F_2$ to the input frequency. However, if the count furthest away from the frequency of the input signal is chosen, the erroneous result that potentially could be produced is eliminated.

Turning now to a discussion of the derivation of an $F_3$ count; if the digital display 58 is to indicate the input frequency to a given resolution, the local oscillator frequency related to the chosen one of the difference frequency signals (i.e., $F_1$ or $F_2$) is regenerated. Thereafter, the resultant difference frequency signal is again gated by the main gate 36 to the direct counting digital counter 30. The gate time, however, is substantially longer than the previous gate time, and related to the required resolution. For example, if it is required to display the input frequency to a resolution of 1 Hz., the difference frequency signal is counted for a period of one second. The display of input signals to lesser resolutions, require correspondingly shorter periods of counting time. The resulting count is the $F_3$ count discussed above, which is added to the related local oscillator frequency in an algebraic manner by the algebraic adder 52 to produce a resultant sum signal. This sum signal is then applied to the digital display 58 causing a display having the required resolution. As noted above, in most cases an $F_3$ count will be made since the gate time for the $F_1$ and $F_2$ counts will be too short and, thus, inadequate to provide the desired resolution.

As also noted above, the offset frequency can either be a predetermined value that remains the same for each value of N, or it can change for different ranges of N. A signal generator 64, suitable for use by the embodiment of the invention illustrated in FIG. 1 when the offset frequency remains the same throughout the entire range of operation is illustrated in FIG. 2. A modification of the system illustrated in FIG. 2, suitable for forming a signal generator wherein the offset frequency changes for different ranges of N, is illustrated in FIG. 3.

The signal generator 64 illustrated in FIG. 2 comprises: a voltage controlled oscillator (VCO) 71; a loop filter 73; a phase detector 75; a low pass filter 77; a band pass filter 79; a divider 81; a multiplier 83; first and second mixers 85 and 87; a divide by 2N divider 89; and, an AND gate 91.

The output from the reference oscillator 66 is applied to: the signal input of the divide by 2N divider 89; one input of the second mixer 87; and, the input of the multiplier 83. The output of the multiplier 83 is connected to one input of the first mixer 85. The output of the first mixer is applied through the low pass filter 77 to the input of the divider 81. The output of the divider 81 is connected to one input of the phase detector 75. The output of the phase detector 75 is connected through the loop filter 73 to the voltage control input of the VCO 71. The output of the VCO 71 is the $F_R$ or the $F_R - F_0/N$ signal to be applied to the harmonic generator 62. The same signal is applied to the second input of the first mixer 85.

The divide by 2N divider 89 also receives the N control signal produced by the sequential stepper 44 of the digital processor 40. The output of the divide by 2N divider is connected to one input of the AND gate 91. The offset control signal produced by the local oscillator offset control 46 of the digital processor 40 is connected to the second input of the AND gate 91. The output of the AND gate 91 is connected to the second input of the second mixer 87. The output of the second mixer 87 is applied through the band pass filter 79 to the second input of the phase detector 75.

If it is desired to produce $F_R$ as opposed to $F_R - R_O/N$, i.e. it is desired to produce a non-offset signal, the AND gate 91 is disabled by the offset signal. In this case, only the phase lock loop is operable and locks to a signal determined by the related values of the multiplier, the divider and the input frequency. For example, if: the VCO has a range of 1.9 – 2.0 GHz; the reference oscillator frequency is 10 MHz; the multiplier 83 multiplies the frequency of its input signal by 180; and, the divider 81 divides its input signal by 20, the phase lock loop will lock to an output frequency of 2.0 GHz. Thus, $F_R$ will equal 2.0 GHz. This signal will be stable because the 2.0 GHz output of the VCO will mix with a 1.8 GHz output of the multiplier 87 (180 × 10MHz). The resultant difference frequency signal (200 MHz) will pass through the low pass filter 77 and be divided by 20 by the divider 81. The resultant 10 MHz signal will compare in the phase detector with the 10 MHz reference oscillator signal passed through the second mixer 87 and band pass filter 79. Thus, a stable phase locked at 2.0 GHz will be produced.

Turning now to the situation where an $F_R - F_0/N$ signal is to be produced. In this case, the AND gate 91 is enabled and the division value of the divide by 2N divider 89 will be set by the value of N. Assuming as a first example that $N = 1$, and that the multiplication factor of the multiplier 83 and the division factor of the divider 81 are as discussed above, and further that the VCO still generates a signal in the 1.9 – 2.0 GHz range and that the output of the reference oscillator 66 is 10 MHz, the inputs to the second mixer 87 will be 5MHz and 10 MHz, resulting in a difference output of 5 MHz. This difference signal will be passed by the band pass filter 79, applied to its related input of the phase detector 75 and cause the output of the VCO to stabilize at 1.9 GHz. The loop will stabilize at this value because it is necessary for the output of the first mixer 85 to stabilize at 100 MHz in order for its related input to the phase detector 75 to stabilize at 5 MHz. In a similar manner, changing N to 2 will cause the output of the VCO to stabilize at 1.95 GHz. Further, changing N to 3 will stabilize the output of the VCO at 1.967 GHz. Thus, it will be appreciated that the value of the output of the VCO will increase as the value of N increases over a range of frequencies.

It will further be appreciated from the foregoing discussion and viewing FIG. 2 that, when the $F_R - F_0/N$ signal (whether it be 1.9, 1.95 or 1.967, etc.) is multiplied by the related value of N, the resultant signal, $NF_R - F_0$ will always be offset from a related $NF_R$ signal by a specific amount. For example, if the $NF_R$ signal is 2.0 GHz (N = 1; $F_R$ = 2GHz), the $NF_R - F_0$ signal will be 1.9 GHz[1(1.9)]. If $NF_R$ is 4.0 GHz, the offset signal will be 3.9 GHz ]2(1.95)]. Further, if the $NF_R$ signal is 6.0 GHz, the offset signal will be 5.9 GHz [3(1.967)]. In this manner, the offset signal is always offset from the non-offset signal by an exact offset value—100 MHz in the illustrated case.

As noted above, FIG. 3 illustrates a modification to FIG. 2 suitable for forming a signal generator wherein the offset value changes as the value of N changes through incremental amounts. The modification illustrated in FIG. 3 replaces the second mixer 87, the band pass filter 79, the AND gate 91 and the divide by 2N divider 89 illustrated in FIG. 2. The modification illustrated in FIG. 3 comprises: a selector control 96; first and second dividers 97 and 99; three two-input AND gates 101, 103 and 105; and, a three-input OR gate 107.

The N control signal is applied to the control input of the selector 96 and controls which one of three output lines is to be selected. The offset control signal is also applied to the selector, and when in a suitable state enables the selector. Each output line is connected to an enable input of one of the three AND gates 101, 103 and 105. The reference oscillator signal is applied directly to the other input of the first AND gate 101. The reference oscillator signal is also applied through the first divider 97 to the second input of the second AND gate 103. The output of the first divider 97 is also applied through the second divider 99 to the second input of the third AND gate 105. The outputs of the three AND gates 101, 103 and 105 are connected to the three inputs of the OR gate 107. The output of the OR gate 109 is connected to the same input of the phase detector 75 illustrated in FIG. 2 to which the output of the second low pass filter 79 had been connected.

In operation, the value of N controls the selector control such that one and only one of the three AND gates is enabled. For example, the first AND gate may be enabled if N is 1, 2 or 3, the second AND gate may be enabled if N is 4, 5 or 6, and the third AND gate enabled if N is 7, 8 or 9. If the first AND gate is enabled by the selector 97, the reference oscillator signal is not divided and is applied directly to the related input of the phase detector. Alternatively, if either of the second or third AND gates is enabled, the reference oscillator signal, divided once or twice depending upon the gate enabled, is applied to the related input of the phase detector. Since the frequency of the N related input of the phase detector changes in accordance with stepped increments in the value of N, it will be readily appreciated that the offset signal also changes and is different for different values of N. However, since the digital processor knows the value of N, it can readily be programmed to store a related offset signal value for algebraic accummulation.

It will be appreciated that the modification illustrated in FIG. 3 for controlling the offset value is digital in nature and, thus, substantially less expensive than the related portion of the signal generator illustrated in FIG. 2, which is generally analog in nature. In essence, the FIG. 3 modification causes an increase in the function to be provided by the digital processor, but reduces the complexity of the overall system. The end result is that the cost of the overall system is reduced since it is less expensive to suitably program a digital processor than it is to produce hardware for performing in an analog manner somewhat related functions.

In addition to illustrating a preferred form of a signal generator 64, FIG. 2 also illustrates a jitter generator 68. The jitter generator 68 comprises an AND gate 93 and a noise generator 95. A jitter control signal is applied to the first or enable input of the AND gate 93. The output of the noise generator 95 is applied to the second or signal input of the AND gate 93. The output of the AND gate 93 is connected to a modulation input of the VCO 71. It will readily be appreciated from this description that when an enable signal is applied to the enable input of the jitter generator 68, the noise generator output modulates the output of the VCO 91. The modulation signal randomly frequency modulates the local oscillator signal to preclude phase lock between the local oscillator signal and the input signal. This action occurs only when the $F_1$ and $F_2$ counts are being made and stored during a counting sequence.

Several examples of the operation of the frequency counter of this invention follow. These examples are all related to the fixed offset frequency embodiment of the invention and are intended to provide a further explanation of the purposes of the various components of the frequency counter of the invention, and to show how special cases have been considered, contemplated and provided for in the operation of the invention.

It will be assumed, for purposes of the following discussion and examples, that the following relationship and parameters pertain:

$F_R$ = 2 GHz (fundamental local oscillator frequency)
$F_O$ = 100 MHz (offset frequency)
$F_D$ = 50 MHz (max. tolerable FM deviation)
$F_{DC}$ = 1025 MHz (max. count frequency of digital counter)
$N$ ranges from 0 to 9

When $N$ = 0, generator 64 is disabled and the local oscillator frequency equals zero, i.e. $F_{LO}$ = 0 The preliminary offset frequency measurement gate time is 1μsec.

EXAMPLE 1

Input frequency = GHz (CW)

Assuming that the frequency counter of this invention has just been turned on, a measurement sequence is initiated by setting $N$ = 0, and disabling the generator 64. No difference frequency signal is detected by the level detector 38, because the signal applied to the low pass filter is 4.3 GHz and because the low pass filter will not pass any signals higher than 1025 MHz. The local oscillator signal is then set at 2 GHz ($N$ = 1) and once again no difference frequency signal is detected by the level detector 38 because of the operation of the low pass filter 28. $N$ is then set at 2, making the local oscillator frequency 4 GHz. An I.F. signal or difference frequency signal of 300 MHz is now passed by the low pass filter 32, detected by the level detector 38 and analyzed by the band comparator 42. As a result of the receipt of this signal, the main gate 36 is enabled for a period of 1μsec. During this period of time the difference frequency signal is passed to the direct counting digital counter, where it is measured and a count related to its value is stored in the digital processor. This count, $F_1$, has a resolution of 1 MHz due to the 1μsec gate time. The count is, of course, equal to 300 MHz to this degree of resolution.

The local oscillator frequency is then offset (downwards in accordance with the previous description) by 100MHz. The new local oscillator frequency is, therefore, 3.9 GHz. For purposes of discussion, the new value for the digital multiplier $N$ is referred to as 2- to denote the downwards offset from $N$ = 2. The main gate 36 is again opened for a period of 1μsec and another difference frequency measurement is made, since the difference between 3.9 and 4.3 GHz (400 MHz) is within the direct counting capability of the digital counter. A count $F_2$, having a value of about 400 MHz, is stored as a result of this measurement.

The comparator 54 now determines that $F_2$ is greater than $F_1$, indicating that the unknown input signal is at a frequency which is higher than either the principal or the offset local oscillator frequency because the downward offset of the local oscillator frequency resulted in the measurement of a higher difference frequency. Since the band comparator determined that both difference frequency signals, at 300 MHz and 400 MHz respectively, were within the direct counting capability of the direct counting digital counter 30, and since the comparator determined that their related local oscillator signals both lie below the frequency of the input signal, either local oscillator signal can be used to develop a higher resolution $F_3$ count. Therefore, in order to avoid any unnecessary time delay, the local oscillator frequency is left unchanged at 3.9 GHz ($N$ = 2-), and the main gate 36 is re-opened for a precise period of time whose length is dependent upon the desired resolution of the input signal display. If, for example, the input frequency is to be displayed to a resolution of 1 Hz, the main gate 36 is enabled for 1 second; whereas, if it is required to display the frequency of the input signal to a resolution of, say, 1 KHz, the main gate is enabled for a period of 1 msec. Or, if only 100 KHz resolution is required the main gate is enabled for only 10μsec.

In any event, the resultant $F_3$ count made by the direct counting digital counter 30 over the precise period of time is algebraically added to the local oscillator frequency by the algebraic adder 52, and the resultant count is displayed on the digital display 58.

EXAMPLE 1(a)

Input frequency same as above — subsequent count sequence

The assumption is made that, in general, the input signal will remain fairly constant, within a reasonably closely defined frequency bandwidth. Thus, the next measurement sequence made by the frequency counter according to this invention is made with the initial assumption that the input frequency has not changed. Because of this assumption the former local oscillator frequency of 3.9 GHz ($N$ = 2-) is maintained and, thus, time delays are avoided. If this assumption proves incorrect because at this local oscillator frequency no difference frequency is detected, the measuring sequence will start all over, beginning at $N$ = 0. If, however, an I.F. is detected by the level detector 38 and passes the test performed by the band comparator, a 1μsec count, designated $F_{2,2}$, is made and compared with the $F_2$ count made in the previous measurement sequence.

If the difference between the $F_{2,2}$ and $F_2$ counts denotes a difference frequency shift of more than 100 MHz, the sequential stepper 44 is operated to re-set $N$ to O, and a new measuring sequence is initiated. However, if the difference between the $F_2$ and $F_{2,2}$ counts is less than 100 MHz, the frequency of the local oscillator output remains at its previous value. This mode of operation will prevail until such time as no I.F. signal is detected by level detector 38, or a count, made over a 1μsec count period, is different than the previous stored count by an amount indicating a difference frequency shift greater than 100 MHz.

In addition, in a commercial embodiment of a microwave frequency counter according to this invention, preferably, additional comparator means are provided to ensure that no stored count of a difference frequency is used if the count is below a certain value (say, 50 MHz for 1μsec count) so as to preclude the possibility of incorrect measurement or loss of information in the event that the input signal is heavily FM modulated.

EXAMPLE 2

Input frequency = 3.3 GHz (CW)

A measuring sequence is initiated and the sequential stepper 44 steps the local oscillator frequency through $N = 0$, $N = 1$ and $N = 2$ values before any difference frequency signal is passed by the low pass filter and a suitable I.F. is detected by the level detector 38 and analyzed by the band comparator. In this case, using the above parameters and constants, when N is set at 2, the local oscillator frequency is 4.0 GHz and, thus, $F_1$ is a 700 MHz count. When the local oscillator frequency is offset to 3.9 GHz ($N = 2-$), 600 MHz $F_2$ is count is made. Since $F_2$ is less than $F_1$, the input frequency is determined to be below both principal and offset local oscillator frequencies. Since both 700 MHz and 600 MHz are within the direct counting capability of the digital counter 30, and since neither value is less than 50 MHz, the $F_3$ count is made at $N = 2-$. Again, the predetermined period of time over which the $F_3$ count is made will depend upon the desired resolution, as discussed above. After being determined, the $F_3$ count is subtracted from (i.e., algebraically added to) the relevant local oscillator frequency — 3.9 GHz.

EXAMPLE 3

Input frequency = 7.0 GHz, with 50 MHz p—p FM.

In this example, the sequential stepper will step through $N = 0, 1, 2$ and 3 before any detectable I.F. is applied by the amplifier 32 to the level detector 38. At that time, the local oscillator frequency is 6.0 GHz. Because the input signal is being heavily FM modulated, and in view of the sharp I.F. filter response, a 1μsec frequency measurement to determine the $F_1$ count will result in a count denoting an I.F. anywhere between 0.975 GHz and 1.025 GHz depending on the phase relationship between the modulating waveform of the FM when the measurement is made, and the clock signal of the direct counting digital counter. In any event, an $F_1$ count is made and stored.

The local oscillator frequency is then stepped downward, as discussed above, to an $N = 3-$ value, and a local oscillator output frequency of 5.9 GHz is produced. At this local oscillator frequency no detectable I.F. is passed by the level detector 38 to the band comparator because the I.F. produced will be in a frequency range (1.075 - 1.125 GHz) just above the break point of the low pass filter 28. Since no suitable I.F. is detected, the sequential stepper will step the local oscillator frequency to 7.9 GHz; i.e. to $N = 4-$ value. A difference frequency will now be detected since it will lie anywhere between 875 and 925 MHz, again depending upon the phase relationship between the modulating waveform of the FM and the clock signal of the digital counter. Thus, an $F_2$ count will be made and stored.

Since when $F_1$ and $F_2$ are compared, both will be found to lie within the direct counting capability of the digital counter 30 and neither related to a difference frequency below 50 MHz, N will be left at $N = 4-$, during the $F_3$ count period. The resultant $F_3$ count is then subtracted from the 7.9 GHz local oscillator signal by the algebraic adder 52, and the result displayed in the manner previously discussed.

EXAMPLE 4

Input frequency = 7.025 GHz, with 50 MHz p—p FM.

In this example, because of the heavy FM modulation, the sequence stepper steps N from 0 to 3, at which point one of two different events might occur. They are:

1. An I.F. may be detected by level detector 38. This event will occur if the input frequency is not at 7.025 GHz when the count is made, i.e. it is somewhere within 7.00 and 7.025 GHz. In this case, an $F_1$ count is made and stored. Thereafter, $N$ is set to $3-$, and the detected I.F. will disappear. $N$ will then be set to $4-$ causing the local oscillator frequency to achieve a 7.9 GHz value. When this occurs, an I.F. will be detected, and the frequency measurement will be completed in the manner previously described.

2. No I.F will be detected. In this case, $N$ will be stepped to 4 causing the local oscillator frequency to achieve a value of 8.0 GHz, and, then, an I.F. will be detected. After an $F_1$ count is made and stored, $N$ will be offset to $4-$ (local oscillator frequency = 7.9 GHz), an I.F. will be detected and the frequency measurement sequence completed.

In both cases of this example, the difference between 7.9 GHz ($N = 4-$) local oscillator count and the $F_3$ count, taken over a given period of time related to a predetermined resolution, will be displayed.

EXAMPLE 5

Input frequency = 8.0 GHz (CW)

Parenthetically, it should be noted that, as discussed above, at all times that a difference frequency measurement (i.e. $F_1$ or $F_2$ count) is being made according to this invention, the signal generator 64 has applied to it the output of the jitter generator 68. The function of the jitter generator is to randomly FM modulate the local oscillator signal. In the described examples, preferably, the modulation applied to the local oscillator signal has a peak-to-peak deviation of about 1 MHz, i.e., the FM frequency is 1 MHz. (An early description of the use of jitter frequency oscillators or jitter generators in low frequency systems is set forth in Hurvitz U.S. Pat. No. 3,012,200 dated Dec. 5, 1961).

In any event, the important point to note is that the jitter frequency oscillator or jitter generator 68 is operated any time that the preliminary, 1μsec, $F_1$ or $F_2$ counts are being made by the direct counting digital counter 30.

Turning now to this example, N is stepped through $N = 0, 1, 2, 3$ and 4. At $N = 4$ an I.F. will be detected by the level detector 38, because the random FM modulation of the local oscillator signal caused by the jitter generator 68 will preclude the occurrence of "a zero-beat" condition between the local oscillator signal and the input signal. If the maximum peak-to-peak FM deviation of the local oscillator output due to the jitter generator is approximately 1 MHz, an I.F. of about 0.5 MHz will be measured and produce an $F_1$ count. The sequential stepper 44 then operates to step $N$ to 4—, at which the I.F. will be about 100 MHz and an $F_2$ count will be made and stored. $F_3$ is then measured with the local oscillator frequency remaining at 7.9 GHz and, then, the input frequency is calculated and displayed by the digital display 58.

EXAMPLE 6

Input frequency = 7.9 GHz (CW)

This is another example where the jitter generator will preclude erroneous or "zero-beat" sampling of the input signal. In this example, when $N$ has been stepped to 4, an $F_1$ count relating to an I.F. of about 100 MHz will be made. Once again $N$ will be set to 4— and an $F_2$ count related to an I.F. of about 0.5 MHz, will be made. In this instance, the digital processor 40, particularly the band comparator 42, will note the small value of $F_2$, and that the input signal is between the two local oscillator signals (or substantially identical to one of them). Because of this situation and because the I.F. producing the $F_1$ count is higher than the I.F. producing the $F_2$ count, and the offset control 46 will re-set $N$ to 4. This action will result in a more meaningful count $F_3$ to be made (and reduce the chance of an erroneous measurement being made). The $F_3$ count is then made, and since the input frequency is known to be below the local oscillator frequency, the $F_3$ count will be subtracted from 8.0 GHz ($N = 4$), with the difference being displayed by the digital display 58.

EXAMPLE 7

Input frequency = 7.95 GHz (CW)

In this example, at $N = 4$, a 50 MHz I.F. is detected and an $F_1$ count is made. The local oscillator offset control then creates an $N = 4-$ (7.9 GHz) local oscillator signal and an $F_2$ count denoting a difference frequency of about 50 MHz is made. It will be noted that $F_1$ and $F_2$ are each of the same order magnitude in this example since they each relate to an I.F. of about 50 MHz. Since the downward offset of the local oscillator signal resulted in similar difference frequency measurements, it is known that the frequency of the input signal is between the two related local oscillator frequencies of 7.9 and 8.0 GHz. However, since the two counts are equal, it makes no difference which local oscillator frequency is used to derive $F_3$. In this situation the $N = 4-$ frequency is used to avoid any unnecessary time delay. Thus, the $F_3$ count is made at $N = 4-$ and added to the 7.9 GHz with the result being displayed by the digital display 58.

EXAMPLE 8

Input frequency = 800 MHz (CW)

In this example, as soon as $N$ is set to 0, an I.F. of 800 MHz will be passed by the low pass filter and detected by the level detector 38. However, at this point it is not known whether or not a direct measurement can be made, so an $N = 1$-condition is set whereby a local oscillator frequency of 1900 MHz occurs. Since no I.F. will be detected by the level detector 38 at a local oscillator frequency of 1900 MHz, $N$ is re-set to 0, and the input frequency is directly counted and displayed.

EXAMPLE 9

Input frequency = 1.02 GHz with 50 MHz p—p FM.

It will be recalled that the direct counting capability of the digital counter 30 is 1025 MHz. Therefore, at an input frequency of 1.02 GHz, at $N = 0$ an I.F. normally will be passed by the low pass filter 28 and detected by the level detector 38 (unless the FM varies very slowly). However, it will be noted that if a frequency measurement is to be made at this time, it may show a value for the input frequency at anywhere between zero and 1.025 GHz. Assuming some frequency count is made at $N = 0$, $N$ is next set by the local oscillator offset control 46 to 1-(local oscillator frequency = 1.9 GHz) and an I.F. frequency (which is now 880 MHz) is passed by the low pass filter 28 and detected by the level detector 38. Since the I.F. is greater than 50 MHz, $F_3$ is thereafter measured at $N = 1-$ and the resulting count is subtracted from 1.9 GHz and displayed. In the event no frequency count is made when $N = 0$, $N$ will be stepped to $N = 1$ (2.0 GHz), an $F_1$ count is made. Then the local oscillator frequency is stepped to $N = 1-$ (1.9 GHz) and an $F_2$ count made. An $F_3$ count will next be made at 1.9 GHz and the result subtracted from the 1.9 GHz value.

EXAMPLE 10

No signal present.

In this example, with no input signal supplied to the input terminal 12, the local oscillator signal will be sequentially stepped from 0 GHz ($N = 0$) through 18 GHz ($N = 9$) and then return to $N = 0$. The repetitive stepping of the local oscillator signal will cause an indication of the "searching" mode of operation of the frequency counter of this invention to be made on an indicator located on the front control panel of the device.

There has been described above a frequency counter which is particularly adapted for determining the frequency of microwave frequency signals, where the frequency of such signals may be considerably higher than the direct counting capability of a direct counting digital counter forming part of the frequency counter. All of the circuitry included in the frequency counter of the present invention, except that related to the production of the local oscillator signal, operates at low frequency levels and is formed using inexpensive and easily obtained components.

Because the frequency counter of the present invention is capable of making measurements regardless of whether the local oscillator frequency is above or below the input signal frequency, wider spacing between harmonics is permitted. In the examples given above (which are to be taken as examples only and not as restrictive limitations of the claims appended hereto), the harmonic spacing used was 2.0 GHz. Thus, the frequency measurement of signals at frequencies up to 18.0 GHz, in only 9 sequential steps are possible, using the present invention. It should be noted that the difference frequency between two harmonics — 2.0 GHz — is beyond the passband capabilities of the low pass filter 28. Therefore, no spurious or incorrect signals will be used or erroneous indications made due to operating with the wrong harmonic or an incorrect relation of the local oscillator signal to the input signal.

Because of the wide harmonic spacing and the high reference oscillator frequency (which is above the direct counting capability of the digital counter), higher local oscillator powers are available at higher harmonics, whereby a frequency counter formed in accordance with this invention has substantially better sensitivity than prior art systems, particularly those that employ a classical heterodyne technique.

It should be noted that where the frequency of the input signal is known to be in a general range, the sequential stepper can be set to the appropriate value of N for the measurement sequence to begin. In an ordinary heterodyne counter, this procedure is dangerous because the value of N might accidently be chosen so that the local oscillator output is higher than the input frequency, in which case an incorrect indication of the input frequency will be given, if any is given at all. However, the present invention, which uses two difference frequency measurements and a comparison of them, will readily determine whether the local oscillator frequency is above or below the input frequency being measured, and will make the appropriate algebraic addition of the relevant local oscillator frequency to a measured I.F. frequency. Hence, the danger of this procedure is greatly reduced.

As noted above, the examples have been stated in numeric terms, in order to more easily explain the operation of a frequency counter formed in accordance with the invention, and so that such operation may be more easily understood. The examples are not intended to be limiting with respect to the scope of the appended claims. It should also be noted that in the drawings elements are shown substantially entirely in block form, with each of the components being identified by function and using the names for such components generally known to persons skilled in the art to which this invention relates. Because all of the components used in this invention operate substantially below the microwave frequency measurement range, (except the local oscillator whose operation is well known), other equivalent and like-acting components may be used without departing from the spirit and scope of the appended claims.

The embodiments of the invention in which an exclusive property or privilege is claimed are defined as follows:

1. A frequency counter suitable for determining the unknown frequency of an input signal over a wide frequency range up to and including at least a portion of the microwave frequency range comprising:
   1. a local oscillator means suitable for selectively producing one of:
      a. a sequence of principal local oscillator signals, said principal local oscillator signals comprising a fundamental frequency and a predetermined number of harmonics of said fundamental frequency; and,
      b. a sequence of offset signals, one offset signal related to each of said principal local oscillator signals each of said offset signals being at a frequency offset from its related principal local oscillator signal by a predetermined amount;
   2. a two-input mixer means, having one input connected to receive the signal whose frequency is to be determined and a second input connected to said local oscillator means for receiving a selected one of the signals produced by said local oscillator means, for producing a signal having a frequency equal to the difference between the two signals applied to the inputs of said two input mixer;
   3. a controllable gate having a signal input connected to the output of said mixer for passing the difference signals produced at the output of said mixer when said controllable gate is enabled;
   4. frequency counting means connected to the output of said controllable gate for counting the frequency of signals passed by said controllable gate, said frequency counter having a maximum frequency counting capability;
   5. a control and summation means for controlling the operation of said local oscillator means and said controllable gate and for summing a predetermined count made by said frequency counting means with the frequency of the signal produced by said local oscillator means when said predetermined count was made, said control and summation means:
      a. connected to the output of said mixer means, for receiving the output thereof and determining whether or not said output includes a signal whose frequency is below the maximum frequency counting capability of said frequency counting means;
      b. connected to the enable input of said controllable gate for enabling said controllable gate when the output of said mixer means includes a signal whose frequency is below the maximum frequency counting capability of said frequency counting means;
      c. connected to said local oscillator means for controlling said local oscillator means such that said local oscillator means:
         i. produces, one-at-a-tine, said sequence of principal local oscillator signals until the output of said mixer means includes a first signal whose frequency is below the maximum frequency counting capability of said frequency counting means; and,
         ii. subsequent to the occurrence of said first signal being included in the output of said mixer, produces one of said sequence of offset signals, said one of said sequence of offset signals being the one related to the one of said sequence of principal local oscillator signals produces when said first signal was included in the output of said mixer; and,
      d. connected to said frequency counting means for receiving the counts made by said frequency counting means.

2. A frequency counter as claimed in claim 1, wherein said control and summation means also controls said local oscillator means such that, if said one of said sequence of offset signals does not cause the output of said mixer means to include a second signal whose frequency is below the maximum frequency counting capability of said frequency counting means, said local oscillator means produces a second of said sequence of offset signals, said second of said sequence of offset signals being the offset signal related to one of the principal local oscillator signals adjacent to said one of said sequence of principal local oscillator signals produced when said first signal was included in the output of said mixer.

3. A frequency counter as claimed in claim 2, wherein said sequence of offset signals are frequency offset downwardly from their related principal local oscillator signals by said predetermined amount.

4. A frequency counter as claimed in claim 3 wherein said predetermined amount is the same regardless of value of the related principle local oscillator signal.

5. A frequency counter as claimed in claim 3, wherein said predetermined amount varies and is related to the value of said related principle local oscillator signals.

6. A frequency counter as claimed in claim 2, wherein said predetermined amount varies and is related to the value of said related principle local oscillator signal.

7. A frequency counter as claimed in claim 2, wherein said predetermined amount is the same regardless of value of the related principle local oscillator signal.

8. A frequency counter as claimed in claim 2, wherein said control and summation means also controls said:
   a. local oscillator means such that no local oscillator signal is produced for a period of time prior to the production of said sequence of principal local oscillator signals;
   b. controllable gate such that if said signal whose frequency is to be counted is at a frequency level below the maximum frequency counting capability of said frequency counting means, said controllable gate is enabled to pass said signal whose frequency is to be determined to said frequency counting means during the period of time said local oscillator means produces no local oscillator signal as said first signal;
   c. local oscillator means such that, if a first signal is passed to said frequency counting means during the period of time said local oscillator means produces no local oscillator signal, the offset signal related to said fundamental frequency principal local oscillator signal is immediately produced thereafter; and,
   d. controllable gate such that, if the output of said mixer means, when the offset signal related to said fundamental frequency principal local oscillator signal is being produced, includes a signal having a frequency below the maximum frequency counting capability of said frequency counting means, said controllable gate is enabled to pass said signal to said frequency counting means as said second signal.

9. A frequency counter as claimed in claim 2, wherein said local oscillator means comprises:
   a signal generator for generating both said fundamental frequency principal local oscillator signal and a signal offset from said fundamental frequency;
   a harmonic generator connected to the output of said signal generator for producing a signal including the fundamental frequency and the harmonics thereof of the signal present on the output of said signal generator; and,
   a controllable filter connected to the output of said harmonic generator for passing a signal at a selected one of the fundamental frequency and the harmonics thereof produced by said harmonic generator.

10. A frequency counter as claimed in claim 9, wherein said control and summation means includes:
   a. a sequential stepper connected to said controllable filter such that signals, at fundamental and then the harmonics thereof produced by said harmonic generator, are sequentially passed by said controllable filter, one signal at a time, and to said signal generator so as to control the value of said predetermined offset when one of said sequence of offset signals is being produced by said generator; and,
   b. a local oscillator offset control connected to said signal generator for controlling whether one of said sequence of offset signals is to be produced by said local oscillator means.

11. A frequency counter as claimed in claim 10, wherein said control and summation means also includes:
   a storage and comparator unit connected to receive the counts made when said first and second are signals counted by said frequency counting means, store said counts, and compare said counts in a predetermined manner; and,
   an algebraic adder for summing a predetermined count made by said frequency counting means with the frequency of the signal produced by said local oscillator when said predetermined count was made, the result of said summation being equal to the frequency of the signal whose frequency is to be determined.

12. A frequency counter as claimed in claim 11, including a digital display connected to said algebraic adder of said control and summation means for producing a digital display of the summation made by said algebraic adder.

13. A frequency counter as claimed in claim 12, wherein said two-input mixer means includes a two-input mixer and a low pass filter connected to the output of said two-input mixer, the output of said low pass filter being connected to said control means and to the signal input of said controllable gate.

14. A frequency counter as claimed in claim 13, wherein said control and summation means is a digital processor.

15. A frequency counter as claimed in claim 14, wherein:
   a. said storage and comparator unit of said digital processor compares said counts of the frequency of said first and second signals;
   b. in accordance with the results of said comparison said digital processor controls said signal generator and said tunable filter such that a predetermined one of the local oscillator signals produced when said counts of the frequency of said first and second signals were made is again produced and enables said controllable gate for a predetermined period of time related to the desired resolution of a frequency count to be displayed;
   c. said frequency counting means, during the period of time that said controllable gate is enabled makes a third frequency count;
   d. said algebraic adder of said digital processor adds said third frequency count to the frequency of the local oscillator signal produced when said third frequency count was made to provide a final frequency count equal to the frequency of the signal whose frequency is to be determined; and,
   e. said digital display receives and displays said final frequency count.

16. A frequency counter as claimed in claim 15, including a reference oscillator connected to said digital processor and to said signal generator.

17. A frequency counter as claimed in claim 16, including an amplifier connected to the output of said low pass filter, the output of said amplifier being connected to the signal input of said controllable gate; and, a level detector connected between the output of said amplifier and the related input of said digital processor.

18. A frequency counter as claimed in claim 17, wherein said signal generator comprises:
   a VCO;
   a first two-input signal generator mixer having one input connected to the output of said VCO;
   a multiplier having its input connected to the output of said reference oscillator and its output connected to the second input of said first two-input signal generator mixer;

a low pass filter having its input connected to the output of said first two-input signal generator mixer;

a divider having its input connected to the output of said low pass filter;

a phase detector having one input connected to the output of said divider;

a divide by 2N circuit having its N control input connected to the output of said sequential stepper of said digital processor and its signal input connected to the output of said reference oscillator;

a two-input anding gate having a signal input connected to the output of said divide by 2N divider and an enable input connected to the output of said local oscillator offset control of said digital processor;

a second two-input signal generator mixer having one input connected to the output of said two-input anding gate and a second input connected to the output of said reference oscillator;

a band pass filter having its input connected to the output of said second two-input signal generator mixer and its output connected to the second input of said phase detector; and, a loop filter having its input connected to the output of said phase detector and its output connected to the control input of said VCO;

the output of said VCO forming one of said fundamental frequency signal of said sequence of principal local oscillator signals and a signal offset from said fundamental frequency signal, depending upon whether or not said local oscillator offset control of said digital processor is applying an enable signal to the enable input of said anding gate.

19. A frequency counter as claimed in claim 17, wherein said signal generator comprises:

a VCO;

a two-input signal generator mixer having one input connected to the output of said VCO;

a multiplier having its input connected to the output of said reference oscillator and its output connected to the second input of said two-input signal generator mixer;

a low pass filter having its input connected to the output of said two-input signal generator mixer;

a divider having its input connected to the output of said low pass filter;

a phase detector having one input connected to the output of said divider;

a selector having a control input connected to the output of said sequential stepper of said digital processor and an enable input connected to the output of the local oscillator offset control of said digital processor, said selector producing a plurality of enabling outputs only one of which exists at any point in time;

a plurality of two-input anding gates, one for each enabling output of said selector, the enabling outputs of said selector each being connected to an enabling input of one of said gates;

dividing means connected to the output of said reference oscillator for dividing the output thereof into a plurality of lower frequency signals, each of said lower frequency signals being applied to the signal input of one of said two-input anding gates;

an OR gate having inputs equal in number, and connected to, the outputs of said plurality of two-input anding gates and an output connected to the second input of said phase detector; and, a loop filter having its input connected to the output of said phase detector and its output connected to the control input of said VCO;

the output of said VCO forming on of said fundamental frequency signal of said sequence of principal local oscillator signals and a signal offset from said fundamental frequency signal, depending upon whether or not said local oscillator offset control of said digital processor is applying an enable signal to the enable input of said anding gate.

20. A frequency counter as claimed in claim 15, including a jitter generator having its output connected to said signal generator for modulating the output of said signal generator when said first and second signal counts are being made.

21. A method of determining the unknown frequency of an input signal comprising the steps of:

sequentially mixing said input signal with a step changeable, local oscillator signal, the steps of said step changeable local oscillator signal including signals at a fundamental frequency and a predetermined number of harmonics of said fundamental frequency;

detecting the difference signals produced by the mixing of said input signal with said step changeable local oscillator signal and determining when a first difference signal having a frequency below a predetermined level occurs;

counting said first difference signal over a predetermined, relatively short, time period and producing a first count related thereto;

storing said first count;

offsetting said step changeable local oscillator signal from the value existing when said first difference signal was determined to produce a first offset signal;

mixing said first offset signal with said input signal so as to produce a second difference signal;

counting said second difference signal over a predetermined, relatively short, time period, if said second difference signal is below said predetermined value, and producing a second count related thereto, or raising said first offset signal by an amount generally equal to one harmonic of said fundamental frequency to produce a second offset signal, mixing said second offset signal with said input signal so as to produce an alternate second difference signal and, then, counting said alternate second difference signal so as to produce an alternate second count;

comparing said first count with said second count or said alternate second count, depending upon which is made, to determine if either of said counts is below a predetermined level and, in accordance therewith, producing a further local oscillator signal the same as either the oscillator signal existing when the first count was made or the oscillator signal existing when the second, or alternate second count was made, depending upon which was made;

mixing said further local oscillator signal with said input signal and counting the difference therebetween over a predetermined period of time related to a desired resolution value to produce a third difference frequency count; and, adding said third difference frequency count to the frequency of said further local oscillator signal.

22. The method claimed in claim 21, wherein the offset value of said first and second offset signal remains the same.

23. The method claimed in claim 21, wherein the offset value of said first and second offset signals changes and is related to the frequency steps of the step changeable local oscillator signal.

24. In a method of measuring the unknown frequency of an input signal that may have a frequency lying in the microwave frequency range, wherein said input signal is sequentially mixed with a stepped local oscillator signal and the difference signal therebetween is counted if the frequency of said difference signal falls below a predetermined level, the improvement comprising the steps of:

offsetting said local oscillator signal by an amount substantially less than the difference between the steps of said stepped local oscillator signal after said difference signal is counted to produce a second difference signal, and counting said second difference signal if the frequency thereof falls below said predetermined value.

25. The improvement claimed in claim 24, further comprising the steps of comparing said counts related to the frequencies of said difference signals and, in accordance therewith, choosing one of the signals mixed with said input signal, mixing said chosen signal with said input signal and counting the difference therebetween over a period of time related to a desired count resolution to produce a third difference frequency count, and adding said third difference frequency count to the frequency of the chosen signal to obtain a final count equal to the frequency of the input signal.

* * * * *

UNITED STATES PATENT AND TRADEMARK OFFICE
CERTIFICATE OF CORRECTION

PATENT NO. : 4,063,169
DATED : December 13, 1977
INVENTOR(S) : Roger C. Palmer

It is certified that error appears in the above–identified patent and that said Letters Patent are hereby corrected as shown below:

Claim 1 (Column 22), line 27, delete "tine" and insert —time—.

Claim 19 (Column 26), line 8, delete "on" and insert —one—.

Signed and Sealed this

Thirtieth Day of May 1978

[SEAL]

Attest:

RUTH C. MASON
Attesting Officer

LUTRELLE F. PARKER
Acting Commissioner of Patents and Trademarks